United States Patent
Mizuno (10) Patent No.: US 10,326,926 B2
(45) Date of Patent: Jun. 18, 2019

(54) FOCUS DETECTION APPARATUS AND METHOD, AND IMAGE CAPTURING APPARATUS

(71) Applicant: CANON KABUSHIKI KAISHA, Tokyo (JP)

(72) Inventor: Nobutaka Mizuno, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/862,813

(22) Filed: Jan. 5, 2018

(65) Prior Publication Data

US 2018/0205873 A1 Jul. 19, 2018

(30) Foreign Application Priority Data

Jan. 13, 2017 (JP) .................................. 2017-004603
Dec. 8, 2017 (JP) .................................. 2017-236295

(51) Int. Cl.
| | |
|---|---|
| *H04N 5/232* | (2006.01) |
| *G03B 13/00* | (2006.01) |
| *G03B 13/36* | (2006.01) |
| *H04N 5/369* | (2011.01) |
| *G01J 1/42* | (2006.01) |

(Continued)

(52) U.S. Cl.
CPC ........ *H04N 5/23212* (2013.01); *G01J 1/4209* (2013.01); *G01J 3/0208* (2013.01); *G01J 3/0237* (2013.01); *G02B 7/346* (2013.01); *G03B 13/36* (2013.01); *H01L 27/14627* (2013.01); *H04N 5/3696* (2013.01); *G01J 2003/2806* (2013.01)

(58) Field of Classification Search
CPC ......... H04N 5/23212; H04N 5/232122; H04N 5/3572; G02B 7/28
USPC ................................. 348/251, 345, 349, 350
See application file for complete search history.

(56) References Cited

U.S. PATENT DOCUMENTS

| | | | | |
|---|---|---|---|---|
| 8,786,676 B2 * | 7/2014 | Endo | .................... | H04N 5/3572 348/222.1 |
| 2015/0316833 A1 * | 11/2015 | Watanabe | ................ | G02B 7/28 348/345 |

(Continued)

FOREIGN PATENT DOCUMENTS

| | | |
|---|---|---|
| JP | 2008-052009 A | 3/2008 |
| JP | 2013-171251 A | 9/2013 |
| JP | 2014-222291 A | 11/2014 |

*Primary Examiner* — Anthony J Daniels
(74) *Attorney, Agent, or Firm* — Cowen, Liebowitz & Latman, P.C.

(57) ABSTRACT

A focus detection apparatus that performs phase difference focus detection based on signals of a plurality of colors obtained from an image sensor, which is covered by color filters of the plurality of colors, that performs photoelectric conversion on light incident on the image sensor via an imaging optical system and outputs electric signals, the apparatus comprising: an acquisition unit that acquires an addition coefficient indicating weights to be applied to the signals of the plurality of colors on the basis of characteristic of chromatic aberration of magnification of the imaging optical system; a generation unit that generates a pair of focus detection signals by performing weighted addition on the signals of the plurality of colors using the addition coefficient; and a detection unit that detects an image shift amount between the pair of focus detection signals.

14 Claims, 8 Drawing Sheets

(51) Int. Cl.
*G02B 7/34* (2006.01)
*H01L 27/146* (2006.01)
*G01J 3/02* (2006.01)
*G01J 3/28* (2006.01)

(56) References Cited

U.S. PATENT DOCUMENTS

| | | | | |
|---|---|---|---|---|
| 2016/0127637 A1* | 5/2016 | Takao | ................... | G02B 7/365 |
| | | | | 348/208.12 |
| 2017/0230567 A1* | 8/2017 | Takao | ................ | H04N 5/23212 |
| 2018/0063410 A1* | 3/2018 | Izumi | ................ | H04N 5/23212 |

\* cited by examiner

FOCUS DETECTION APPARATUS AND METHOD, AND IMAGE CAPTURING APPARATUS

BACKGROUND OF THE INVENTION

Field of the Invention

The present invention relates to a focus detection apparatus and method, and an image capturing apparatus.

Description of the Related Art

A phase difference focus detection method (phase difference AF) is known as an automatic focus detection (AF) method used in an image capturing apparatus. The phase difference AF is an AF which is often used in digital still cameras, and some image sensors are used as focus detection sensors. In Japanese Patent Laid-Open No. 2008-52009, in order to perform focus detection based on the pupil division method, a photoelectric conversion unit of each pixel constituting an image sensor is divided into a plurality of portions, and the divided photoelectric conversion units receive light fluxes having passed through different regions of the pupil of the photographing lens via the lens via a microlens.

The phase difference AF can simultaneously detect the focus detection direction and the focus detection amount based on a pair of signals obtained from focus detection pixels formed in the image sensor, and it is possible to perform focus adjustment at high speed. On the other hand, since the phase difference AF utilizes a phase difference between optical images to perform focus detection, the aberration of the optical system which forms an optical image may cause an error to the focus detection result; therefore, a method for reducing such error has been suggested.

Japanese Patent Laid-Open No. 2013-171251 discloses a method for correcting a focus detection error caused by the fact that, in the in-focus state, the shapes of a pair of optical images formed by a pair of light fluxes for focus detection do not coincide due to the aberration of the optical system.

Also, Japanese Patent Laid-Open No. 2014-222291 discloses a method for correcting a focus detection error by using a correction value corresponding to a combination of information on the state of the imaging lens, information on the state of an image sensor, and an image height.

However, in the phase difference AF, focus detection error caused by chromatic aberration of magnification is resulted from a complicated mechanism involving chromatic aberration of an imaging optical system and color shading of an image sensor, and appropriate correction may be difficult when manufacturing variations are further considered.

SUMMARY OF THE INVENTION

The present invention has been made in consideration of the above situation, and, in an image capturing apparatus which performs automatic focus detection by a phase difference detection method based on signals obtained from a plurality of focus detection pixels having different spectral sensitivities, suppresses focus detection error exerted by chromatic aberration of magnification, and performs high precision focus detection.

According to the present invention, provided is a focus detection apparatus that performs phase difference focus detection based on signals of a plurality of colors obtained from an image sensor, which is covered by color filters of the plurality of colors and has a plurality of photoelectric conversion portions for each of a plurality of microlenses, that performs photoelectric conversion on light incident on the image sensor via an imaging optical system and outputs electric signals, the apparatus comprising: an acquisition unit that acquires an addition coefficient indicating weights to be applied to the signals of the plurality of colors on the basis of a characteristic of chromatic aberration of magnification of the imaging optical system; a generation unit that generates a pair of focus detection signals by performing weighted addition on the signals of the plurality of colors using the addition coefficient; and a detection unit that detects an image shift amount between the pair of focus detection signals.

Further, according to the present invention, provided is an image capturing apparatus comprising: a focus detection apparatus that performs phase difference focus detection based on signals of a plurality of colors obtained from an image sensor, which is covered by color filters of the plurality of colors and has a plurality of photoelectric conversion portions for each of a plurality of microlenses, that performs photoelectric conversion on light incident on the image sensor via an imaging optical system and outputs electric signals, the apparatus comprising: an acquisition unit that acquires an addition coefficient indicating weights to be applied to the signals of the plurality of colors on the basis of a characteristic of chromatic aberration of magnification of the imaging optical system; a generation unit that generates a pair of focus detection signals by performing weighted addition on the signals of the plurality of colors using the addition coefficient; and a detection unit that detects an image shift amount between the pair of focus detection signals; the image sensor; and a control unit that controls the imaging optical system based on the image shift amount.

Furthermore, according to the present invention, provided is a focus detection method that performs phase difference focus detection based on signals of a plurality of colors obtained from an image sensor, which is covered by color filters of the plurality of colors and has a plurality of photoelectric conversion portions for each of a plurality of microlenses, that performs photoelectric conversion on light incident on the image sensor via an imaging optical system and outputs electric signals, the method comprising: acquiring an addition coefficient indicating weights to be applied to the signals of the plurality of colors on the basis of a characteristic of chromatic aberration of magnification of the imaging optical system; generating a pair of focus detection signals by performing weighted addition on the signals of the plurality of colors using the addition coefficient; and detecting an image shift amount between the pair of focus detection signals.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings. It is to be noted that embodiments describe a concrete and specific configuration in order to facilitate understanding and explanation of the invention, however the present invention is not limited to such a specific configuration. For example, in the following, an embodiment in which the present invention is applied to a single lens reflex digital camera capable of mounting interchangeable lenses will be described, however the present invention can also be applied to digital cameras and video cameras whose lenses cannot be changed. Further, the present invention can be implemented by any electronic device including a camera, for example, a mobile phone, a personal computer (laptop, tablet, desktop type, etc.), a game machine, or the like.

First Embodiment

[Overall Arrangement]

Figure 1:
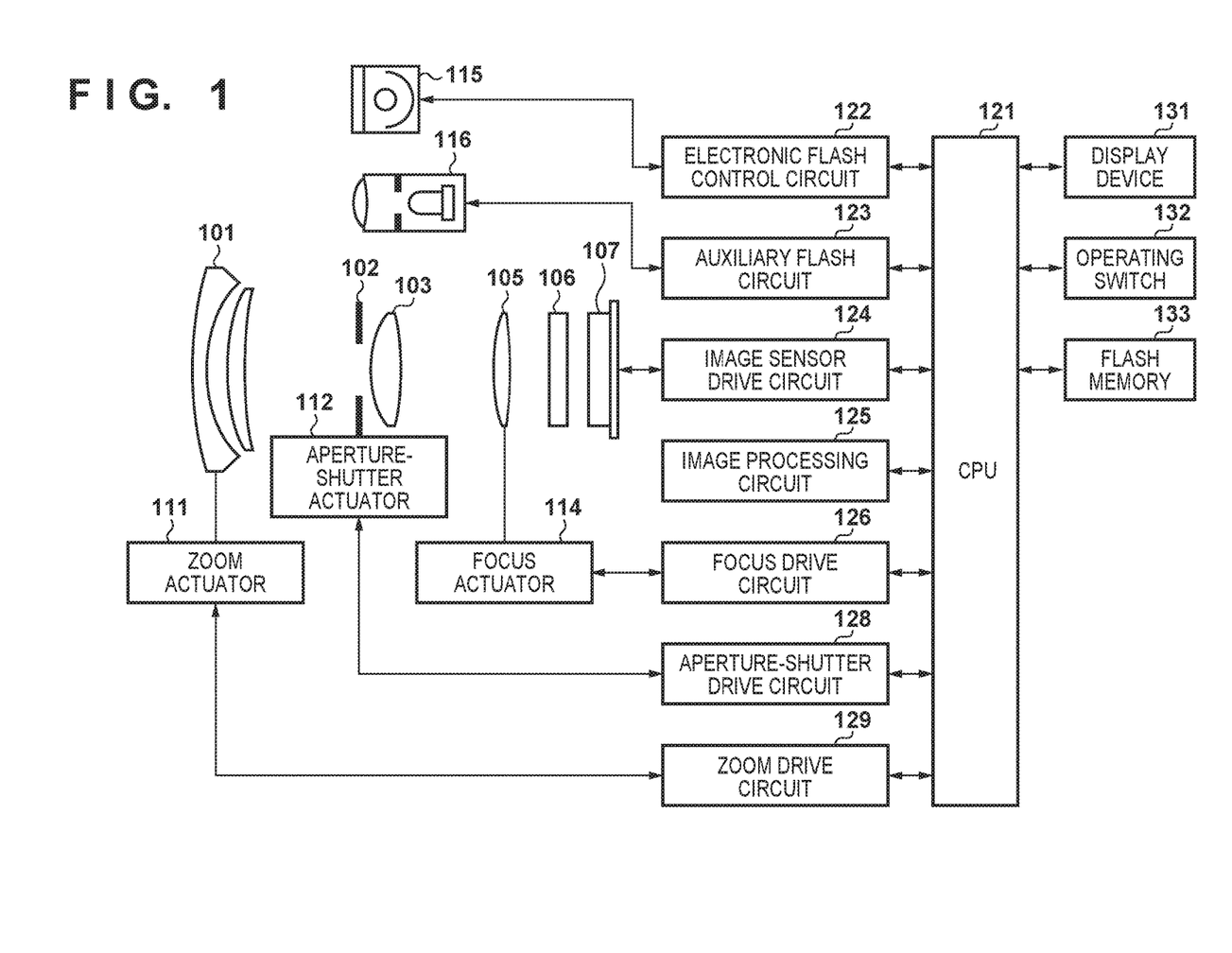
FIG. 1 is a schematic block diagram of an image capturing apparatus according to an embodiment of the present invention.

FIG. 1 is a diagram showing a brief configuration of a camera as an example of an image capturing apparatus having an image sensor according to an embodiment of the present invention. In FIG. 1, a first lens group 101 is disposed on the front end of an imaging optical system, and supported so as to be movable forward and backward along an optical axis. An aperture-shutter 102 adjusts the diameter of its opening, thereby adjusting the amount of light during image sensing, and also has a function to adjust the exposure time during still image sensing. The aperture-shutter 102 and a second lens group 103 move together forward and backward along the optical axis, and, in conjunction with the forward and backward movement of the first lens group 101, provide a magnification change effect (a zoom function).

A third lens group 105 (focus lens) carries out focus adjustment by moving forward and backward along the optical axis. A low-pass optical filter 106 is an optical element for the purpose of reducing false color and moiré of a sensed image. An image sensor 107 is composed of a two-dimensional CMOS photo sensor and the surrounding circuitry, and disposed on an imaging plane of the imaging optical system. The image sensor 107 performs photoelectric conversion on incident light incoming through the imaging optical system, and outputs an electric signal.

A zoom actuator 111 carries out a magnification-change operation by rotation of a cam barrel, not shown, to move the first lens group 101 through the second lens group 103 forward and backward along the optical axis. An aperture-shutter actuator 112 controls the diameter of the opening of the aperture-shutter 102 and adjusts the amount of light for image sensing, and also controls the exposure time during still image sensing. A focus actuator 114 moves the third lens group 105 forward and backward along the optical axis to adjust the focus.

An electronic flash 115 for illuminating an object is used during image sensing. A flash illumination device that uses a Xenon tube is preferable, but an illumination device comprised of a continuous-flash LED may also be used. An AF auxiliary flash unit 116 projects an image of a mask having a predetermined opening pattern onto an object field through a projective lens to improve focus detection capability with respect to dark objects and low-contrast objects.

A CPU 121 controls the camera main unit in various ways within the image capturing apparatus. The CPU 121 may, for example, have a calculation unit, ROM, RAM, A/D converter, D/A converter, communication interface circuitry, and so forth. In addition, the CPU 121, based on predetermined programs stored in the ROM, drives the various circuits that the camera has, and executes a set of operations of AF, image sensing, image processing, and recording.

In addition, the CPU 121 stores correction value calculation coefficients necessary for focus adjustment using the output signal of the image sensor 107. A plurality of correction value calculation coefficients are prepared for a focus state corresponding to the position of the third lens group 105, a zoom state corresponding to the position of the first lens group 101 to the second lens group 103, an F value of the imaging optical system, a set pupil distance of the image sensor 107, and each pixel size. When focus adjustment is performed, an optimum correction value calculation coefficient is selected according to the combination of the focus adjustment state (focus state, zoom state) and the aperture value of the imaging optical system, the set pupil distance of the image sensor 107, and the pixel size. Then, a correction value is calculated from the selected correction value calculation coefficient and the image height of the image sensor 107.

The correction value calculation coefficients also include sets of addition coefficients for weighted addition of RGB signals. In the first embodiment, the addition coefficient sets are stored so as to be selectable according to the lens ID (lens identification information) of the imaging optical system. Then, using the selected addition coefficient set, a focus detection signal is generated. The method of generating the addition coefficient sets and the focus detection signals will be described in detail later.

Further, in the present embodiment, the correction value calculation coefficients will be described as being stored in the CPU 121, however the storage location is not limited to this. For example, in an interchangeable lens type image capturing apparatus, the interchangeable lens having an imaging optical system may have a nonvolatile memory and correction value calculation coefficients may be stored in the memory. In this case, for example, the correction value calculation coefficients may be transmitted to the image capturing apparatus when the interchangeable lens is attached to the image capturing apparatus or in response to a request from the image capturing apparatus.

An electronic flash control circuit 122 controls firing of the electronic flash 115 in synchrony with an image sensing operation. An auxiliary flash circuit 123 controls firing of the AF auxiliary flash unit 116 in synchrony with a focus detection operation. An image sensor drive circuit 124 controls the image sensing operation of the image sensor 107 as well as A/D-converts acquired image signals and transmits the converted image signals to the CPU 121. An image processing circuit 125 performs such processing as γ conversion, color interpolation, JPEG compression and the like on the images acquired by the image sensor 107.

A focus drive circuit 126 controls the drive of the focus actuator 114 based on the focus detection result to drive the third lens group 105 reciprocally in the optical axis direction, thereby performing focus adjustment. An aperture-shutter drive circuit 128 controls the drive of the aperture-shutter actuator 112, thereby driving the opening of the aperture-shutter 102. A zoom drive circuit 129 drives the zoom actuator 111 in accordance with the zoom operation of the user.

A display device 131, such as an LCD, displays information relating to the image sensing mode of the camera, preview images before image sensing, confirmation images after image sensing, a frame indicating a focus detection area and focus state display images during focus detection, and so forth. An operating switch group 132 is composed of a power switch, a release (image sensing trigger) switch, a zoom operation switch, an image sensing mode selection switch, and so on. A detachable flash memory 133 records captured images.

[Image Sensor]

Figure 2:
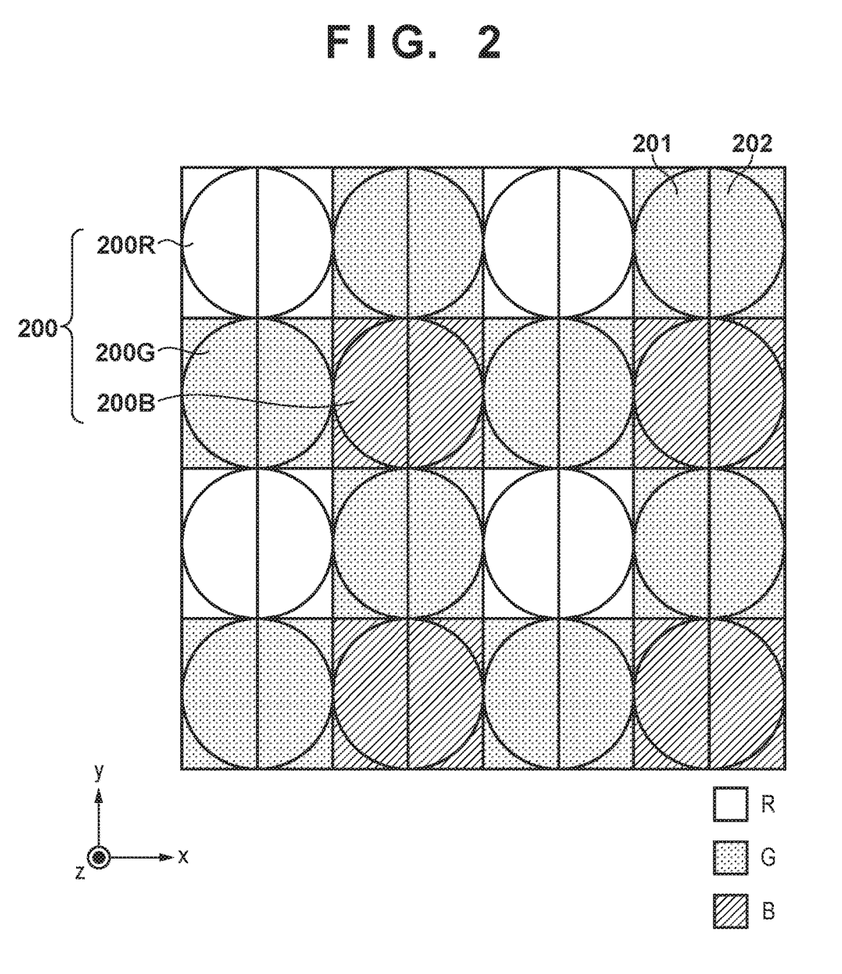
FIG. 2 is a schematic view of a pixel array according to the embodiment.

FIG. 2 shows the outline of an array of the imaging pixels and the focus detection pixels of the image sensor 107 according to the embodiment. FIG. 2 illustrates the pixel (imaging pixel) array within the range of 4 columns×4 rows, or the focus detection pixel array within the range of 8 columns×4 rows in the two-dimensional CMOS sensor (image sensor) according to this embodiment.

A pixel group 200 includes pixels of 2 columns×2 rows covered by color filters of a plurality of colors. A pixel 200R having an R (red) spectral sensitivity is arranged at the upper left position, pixels 200G having a G (green) spectral sensitivity are arranged at the upper right and lower left positions, and a pixel 200B having a B (blue) spectral sensitivity is arranged at the lower right position. Each pixel is formed from a first focus detection pixel 201 and a second focus detection pixel 202 arrayed in 2 columns×1 row.

A number of arrays of 4 (columns)×4 (rows) pixels (8 (columns)×4 (rows) focus detection pixels) shown in FIG. 2 are arranged on a plane to enable to capture an image (focus detection signal).

Figure 3A:
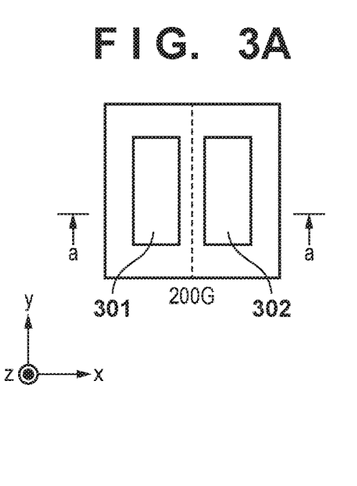
FIGS. 3A and 3B are a schematic plan view and a schematic sectional view, respectively, of a pixel according to the embodiment.
Figure 3B:
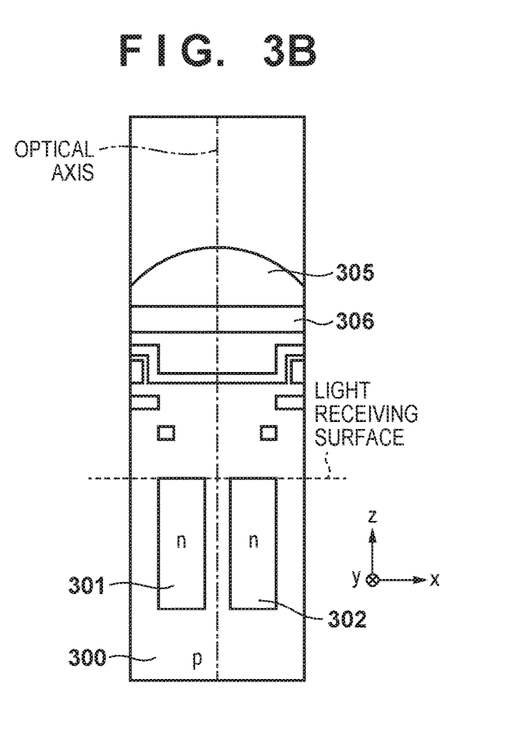

FIG. 3A is a plan view of one pixel 200G of the image sensor 107 shown in FIG. 2 when viewed from the light receiving surface side (+z side) of the image sensor 107, and FIG. 3B is a sectional view showing the a-a section in FIG. 3A viewed from the −y side. As shown in FIGS. 3A and 3B, in the pixel 200G according to this embodiment, a microlens 305 for condensing incident light is formed on the light receiving side of each pixel. Photoelectric conversion units 301 and 302 that divide the pixel by NH (here, divided by two) in the x direction and by NV (here, divided by one, or not divided) in the y direction are formed. The photoelectric conversion units 301 and 302 correspond to the first focus detection pixel 201 and the second focus detection pixel 202, respectively.

Each of the photoelectric conversion units 301 and 302 may be formed as a pin structure photodiode including an intrinsic layer between a p-type layer and an n-type layer or a p-n junction photodiode without an intrinsic layer, as needed.

In each pixel, a color filter 306 is formed between the microlens 305 and the photoelectric conversion units 301 and 302. In the present embodiment, any one of the above-described color filter having spectral sensitivity of R (red), color filter having spectral sensitivity of G (green), and color filter having spectral sensitivity of B (blue) is arranged. However, the spectral sensitivity characteristic of the color filters is not limited to RGB.

Light that has entered the pixel 200G shown in FIGS. 3A and 3B is condensed by the microlens 305, spectrally split by the color filter 306, and received by the photoelectric conversion units 301 and 302. In the photoelectric conversion units 301 and 302, electron-hole pairs are produced in accordance with the received light amount and separated in the depletion layer. Electrons having negative charges are accumulated in the n-type layers (not shown). On the other hand, holes are discharged externally from the image sensor 107 through the p-type layers connected to a constant voltage source (not shown). The electrons accumulated in the n-type layers (not shown) of the photoelectric conversion units 301 and 302 are transferred to electrostatic capacitances (FDs) through transfer gates, converted into voltage signals, and output.

The pixels 200R and 200B shown in FIG. 2 also have the similar structure as the pixel 200G, and output voltage signals corresponding to the light spectrally split by the color filter 306, in a similar manner as the pixel 200G.

Figure 4:
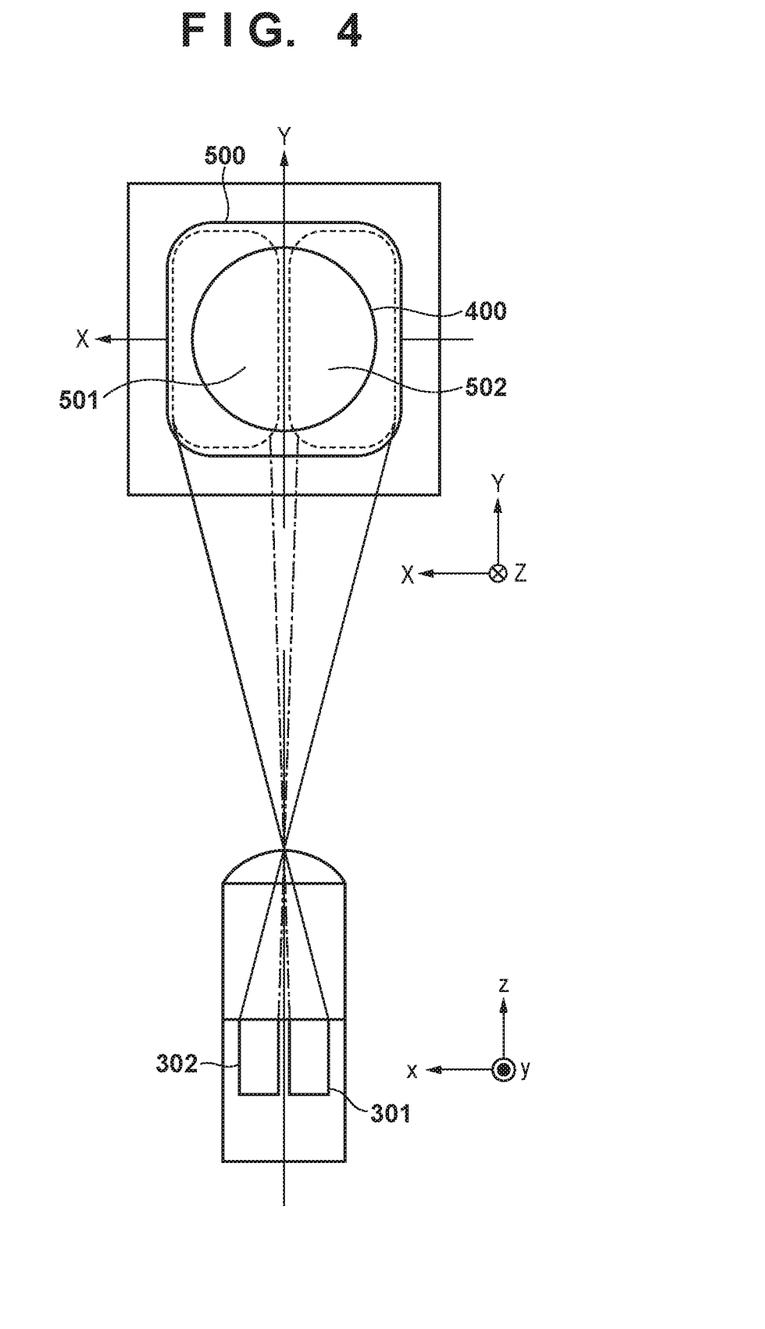
FIG. 4 is a schematic explanatory view of a pixel structure and pupil division according to the embodiment.

The correspondence between pupil division and the pixel structure according to this embodiment shown in FIGS. 3A and 3B will be described with reference to FIG. 4. FIG. 4 illustrates a sectional view showing the a-a section of the pixel structure according to the embodiment shown in FIG. 3A viewed from the +y side and the exit pupil plane of the imaging optical system. Note that in FIG. 4, to obtain correspondence with the coordinate axes of the exit pupil plane, the x- and y-axes of the sectional view are reversed with respect to those of FIGS. 3A and 3B.

A first partial pupil region 501 corresponds to the photoelectric conversion unit 301, and is almost conjugate with the light receiving surface of the photoelectric conversion unit 301 having a center of gravity decentered in the −x direction via the microlens 305, and represents a pupil region which passes light beams that can be received by the photoelectric conversion unit 301. The first partial pupil region 501 has a center of gravity decentered to the +x side on the pupil plane.

Further, a second partial pupil region 502 corresponds to the photoelectric conversion unit 302, and is almost conjugate with the light receiving surface of the photoelectric conversion unit 302 having a center of gravity decentered in the +x direction via the microlens 305, and represents a pupil region which passes light beams that can be received by the photoelectric conversion unit 302. The second partial pupil region 502 has a center of gravity decentered to the −x side on the pupil plane.

Further, a pupil region 500 is a pupil region that can receive light by the entire pixels 200G when the photoelectric conversion units 301 and 302 are combined. Reference numeral 400 denotes an opening of the aperture-shutter 102.

In on-imaging surface phase difference AF, since a pupil is divided using the microlens 305 of the image sensor 107, it is affected by diffraction. Since the pupil distance to the exit pupil plane is several tens of millimeters, while the diameter of the microlens is several micrometers, the aperture value of the microlens 305 becomes tens of thousands, and blurring caused by diffraction of several tens of millimeter level occurs. Therefore, the image on the light receiving surface of the photoelectric conversion units 301 and 302 is not a clear image of the pupil region or a pupil partial region, but represents a pupil intensity distribution (incident angle distribution of the light receiving rate).

Figure 5:
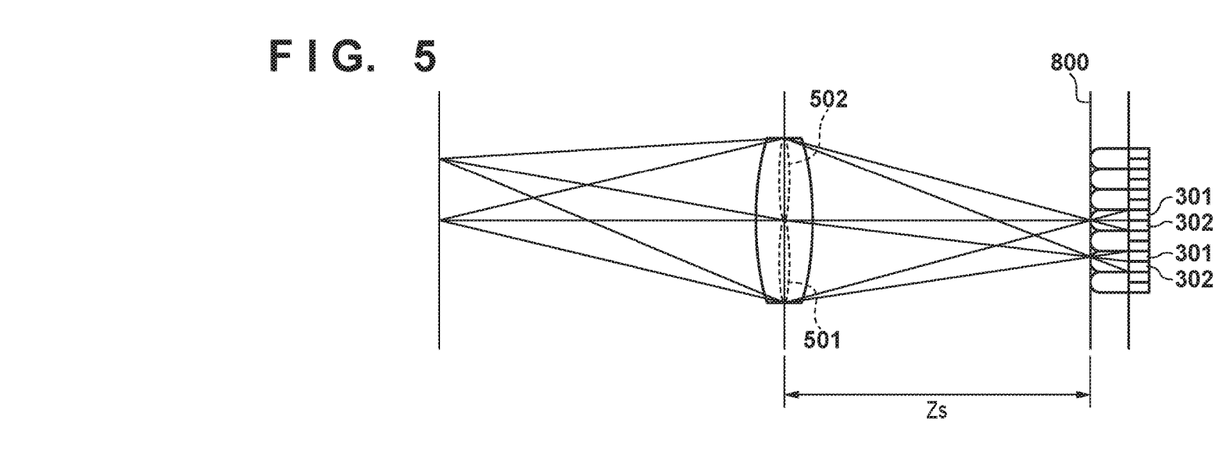
FIG. 5 is a schematic explanatory view of an image sensor and pupil division according to the embodiment.

FIG. 5 is a schematic view showing the correspondence between the image sensor 107 and pupil division according to the embodiment. It is configured so that, at a sensor entrance pupil distance $Z_s$, a light receiving region of the photoelectric conversion unit 301 of each pixel arranged at each position on the surface of the image sensor 107 substantially matches to the corresponding first partial pupil region 501. Similarly, it is configured so that a light receiving region of the photoelectric conversion unit 302 substantially matches to the corresponding second partial pupil region 502. In other words, it is configured so that a pupil division position between the first partial pupil region 501 and the second partial pupil region 502 substantially matches to a division position of each pixel of the image sensor 107 at the sensor entrance pupil distance $Z_s$. A pair of light fluxes that have passed through the different partial pupil regions of an imaging optical system, namely, the first partial pupil region 501 and the second partial pupil region 502 are incident on each pixel of the image sensor 107 at different incident angles, and received by the photoelectric conversion units 301 and 302 which are divided to 2×1. The present embodiment shows a case where the pupil region is divided into two in the horizontal direction. However, the pupil region may be divided in the vertical direction as needed.

Further, in the image sensor 107 of the present embodiment, each imaging pixel includes the first focus detection pixel 201 and the second focus detection pixel 202, however, the present invention is not limited thereto. An imaging pixel that receives the light flux that has passed through the pupil region 500, which is a combination of the first partial pupil region 501 and the second partial pupil region 502 of the imaging optical system, and the first focus detection pixel 201 and the second focus detection pixel 202 may be configured as separate pixels as needed. In that case, the first focus detection pixels 201 and the second focus detection pixels 202 may be arranged in a part of the array of the imaging pixels.

Signals corresponding to received light (referred to as "photoelectric signals", hereinafter) output from the first focus detection pixels 201 of respective pixels of the image sensor 107 having the above configuration are gathered to generate a first focus detection signal, and photoelectric signals output from the second focus detection pixels 202 of the respective pixels are gathered to generate a second focus detection signal, and focus detection is performed. Note that each pixel in the present embodiment is covered with a color filter of any one of green (G), red (R), blue (B), and green (G) as shown in FIG. 2. Therefore, for each pixel group 200 including four pixels of green (G), red (R), blue (B), and green (G), the photoelectric signals output from the first focus detection pixels 201 are added and the resultant signal Y is used as the first focus detection signal, and the photoelectric signals output from the second focus detection pixels 202 are added and the resultant signal Y is used as the second focus detection signal.

Further, by adding the photoelectric signals output from the first focus detection pixel 201 and the second focus detection pixel 202 for each pixel corresponding to each microlens 305 of the image sensor 107, an image signal (addition signal) having a resolution of the effective pixel number N can be generated.

[Relationship Between Defocus Amount and Image Shift Amount]

Figure 6:
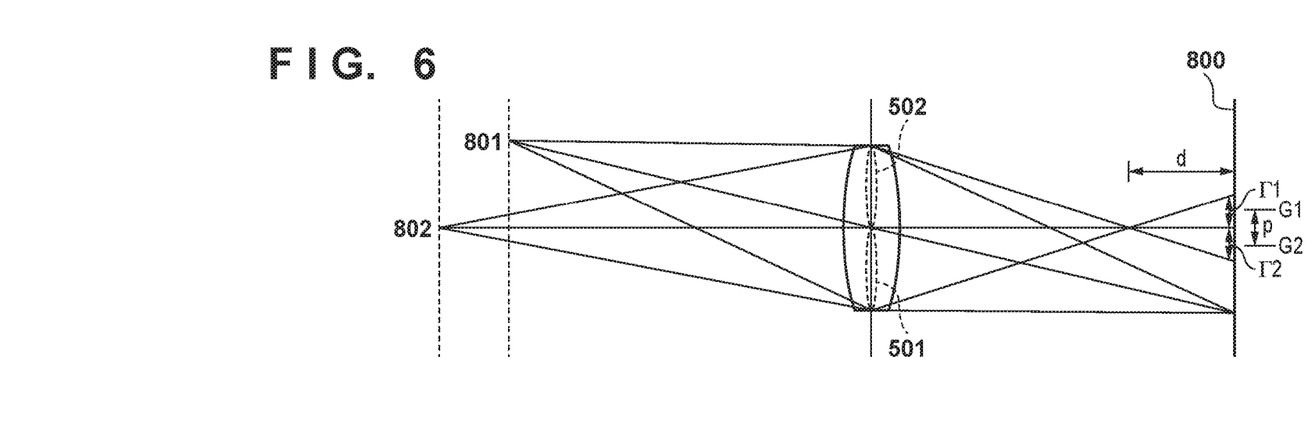
FIG. 6 is a schematic diagram showing a relationship between a defocus amount and an image shift amount of a first focus detection signal and a second focus detection signal according to the embodiment.

Next, the relationship between an image shift amount and a defocus amount of the first focus detection signal and the second focus detection signal acquired by the image sensor 107 of this embodiment will be described. FIG. 6 is a diagram showing the relationship between the defocus amount between the first focus detection signal and the second focus detection signal, and the image shift amount between the first focus detection signal and the second focus detection signal. The image sensor 107 of the present embodiment is arranged on an imaging surface 800, and the pupil region 500 of the imaging optical system is divided into two parts, i.e., the first partial pupil region 501 and the second partial pupil region 502, similarly to FIGS. 4 and 5.

Let the magnitude of a distance from a imaging position of a subject to the imaging surface 800 be |d|, then the defocus amount d is defined as a negative value (d<0)) in a front-focused state in which the imaging position of the subject is closer to the subject than the imaging surface 800, and is defined as a positive value (d>0) in a rear-focused state in which the imaging position of the subject is on the opposite side of the subject with respect to the imaging surface 800. d=0 holds in a focus state in which the imaging position of the subject is at the imaging surface 800 (in-focus position). In FIG. 6, a subject 801 shows an example of the in-focus state (d=0), and a subject 802 shows an example of the front-focused state (d<0). Both of the front-focused state (d<0) and the rear-focused state (d>0) are called a defocus state (|d|>0).

In the front-focused state (d<0), subject light having passed through the first partial pupil region 501 among the luminous flux from the subject 802 converges once, then spreads to the width Γ1 around the center of gravity position G1 of the luminous flux, and a blurred image is formed on the imaging surface 800. The same applies to the subject light that has passed through the second partial pupil region 502, and a blurred image spreading to the width Γ2 is formed around the center of gravity position G2. The blurred image is received by the first focus detection pixels 201 and the second focus detection pixels 202 constituting respective pixel arranged in the image sensor 107, and a first focus detection signal and a second focus detection signal are generated from the obtained photoelectric signals. Therefore, the first focus detection signal and the second focus detection signal are recorded as the subject image in which the object 802 is blurred in the widths Γ1 and Γ2 around the center of gravity positions G1 and G2 on the imaging surface 800. As the magnitude |d| of the defocus amount d increases, the blur widths Γ1 and Γ2 of the subject image increase substantially proportionally. Similarly, the magnitude |p| of the image shift amount p of the subject image (=the difference between the center of gravity positions G1 and G2 of the luminous fluxes) between the first focus detection signal and the second focus detection signal also increases roughly in proportion to the magnitude |d| of the defocus amount d as it increases. The similar relationship holds in the rear-focused state (d>0) although the image shift direction of the subject image between the first focus detection signal and the second focus detection signal is opposite to the front-focused state.

Therefore, with a conversion coefficient K for converting the image shift amount p to the defocus amount d and the image shift amount p of the subject image between the first focus detection signal and the second focus detection signal, the defocus amount d can be calculated.

[Focusing Precision]

The in-focus position obtained by the automatic focus detection (phase difference AF) by the above-described ordinary phase difference detection method is a position at which the defocus amount d=0 holds. However, due to the aberration of the imaging optical system, a detection error with which the defocus amount d=0 does not hold at an actual in-focus position may occur. As a method of suppressing the detection error, there is a method of incorporating a correction value. However, the focus detection error caused by the chromatic aberration of magnification occurs with a complex mechanism involving the color shading of the image sensor 107, and there are cases where it is difficult to appropriately correct the focus detection error, when manufacturing variations is further considered.

Here, focus detection error caused by the chromatic aberration of magnification will be described. In the phase difference AF, the defocus amount d is detected from the image shift amount p between the first focus detection signal and the second focus detection signal. That is, the in-focus position in the phase difference AF is judged when the center of gravity position G1 of the first focus detection signal and the center of gravity position G2 of the second focus detection signal coincide.

Figure 7:
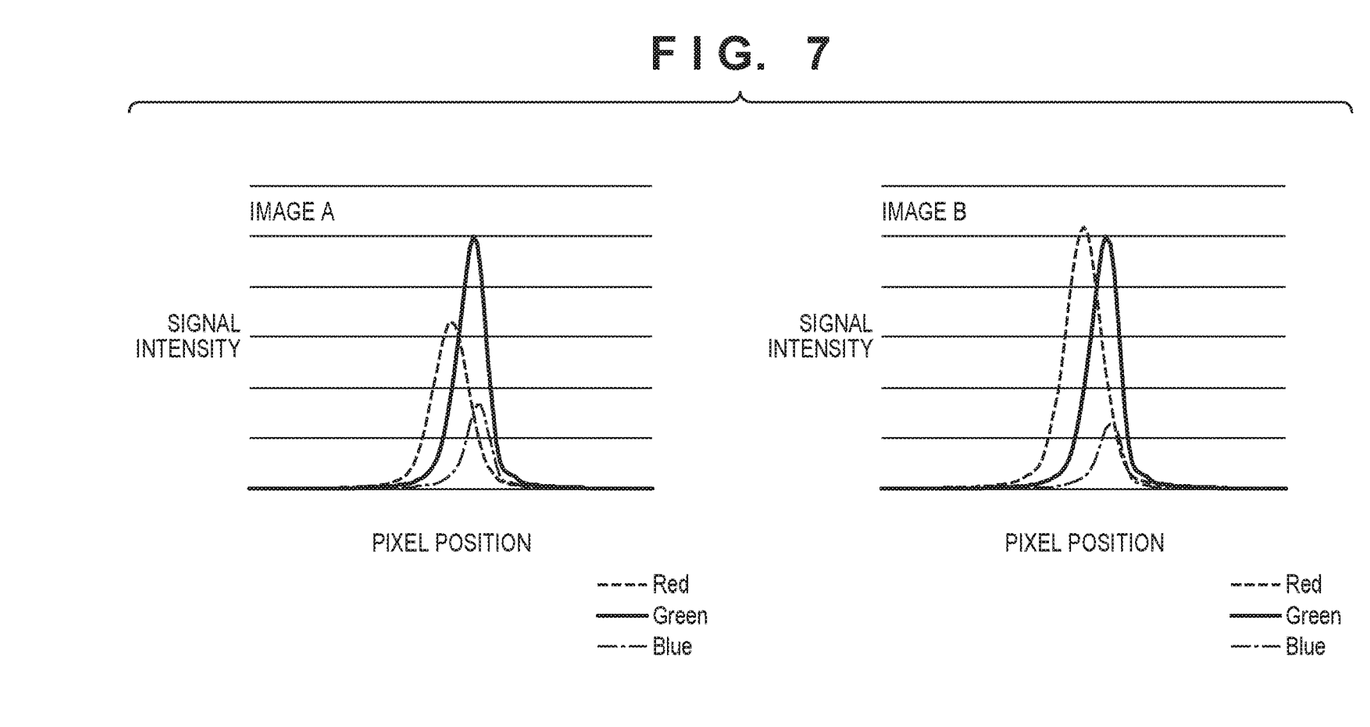
FIG. 7 is a diagram showing line images of respective colors formed with signals corresponding to received light that are output from first focus detection pixels and formed with signals corresponding to received light that are output from second focus detection pixels in an in-focus state according to the embodiment.

With reference to FIG. 7, the procedure for calculating the center of gravity positions G1, G2 of the first and second focus detection signals (signals Y) will be described. FIG. 7 is a view showing an example of line images of respective colors by the photoelectric signals (image A) of the first focus detection pixels 201 and the photoelectric signals (image B) of the second focus detection pixels 202 when the focus lens 104 is in the in-focus position. In FIG. 7, the ordinate represents the signal intensity, and the photoelectric signals of the first focus detection pixel 201 and the photoelectric signals of the second focus detection pixel 202 are standardized with respect to a signal intensity of G signals. The abscissa represents the pixel position where the central coordinate in the horizontal direction of the focus detection area is 0.

First, let the center of gravity positions of the RGB color line images on the abscissa in FIG. 7 be Xr, Xg, Xb [mm], respectively. Further, let the signal intensities of the RGB colors on the ordinate in FIG. 7 be Sr, Sg and Sb. Incidentally, (1) is given to the value of the first focus detection signal and (2) is attached to the value of the second focus detection signal. The contribution ratios Pr, Pg, Pb of each color at the time of calculating the center of gravity are calculated by weighting for RGB signals at the time of creation of the first and second focus detection signals, and are expressed as follows.

$Pr(1)=Sr(1)/(Sr(1)+2Sg(1)+Sb(1))$ $Pg(1)=2Sg(1)/(Sr(1)+2Sg(1)+Sb(1))$ $Pb(1)=Sb(1)/(Sr(1)+2Sg(1)+Sb(1))$ $Pr(2)=Sr(2)/(Sr(2)+2Sg(2)+Sb(2))$ $Pg(2)=2Sg(2)/(Sr(2)+2Sg(2)+Sb(2))$ $Pb(2)=Sb(2)/(Sr(2)+2Sg(2)+Sb(2))$

The reason why only the coefficient of Sg is 2 is because two pixels of green(G) are included in the pixel group 200. Here, the difference between the center of gravity positions of the line image of each RGB corresponds to the chromatic aberration of magnification, and a contribution rate for each color corresponds to the difference in color shading between the first focus detection pixel 201 and the second focus detection pixel 202.

Here, the center of gravity position G1 and the center of gravity position G2 are obtained by multiplying the center of gravity positions Xr, Xg, Xb of the RGB color line images by color contribution ratios Pr, Pg, Pb of respective colors.

$G1=\Sigma Xi(1)Pi(1),(i=r,g,b)$ $G2=\Sigma Xi(2)Pi(2),(i=r,g,b)$ $\Delta G=G1-G2$ [mm]

$\Delta G$ is the difference between the centers of gravity of the first focus detection signal and the second focus detection signal at the in-focus position by focus detection obtained by the phase difference AF using the first focus detection signal and the second focus detection signal.

Since the center of gravity positions of the line images of the photoelectric signals from the first focus detection pixels 201 and the photoelectric signals from the second focus detection pixels 202 in the same color are almost equal at the in-focus position by focus detection, $Xi(1)=Xi(2)(i=r,g,b)$ is assumed.

Therefore, when $\Delta G=0$, it means that the centers of gravity of the first focus detection signal and the second focus detection signal at the in-focus position by focus detection are equal, and there is no focus detection error caused by the chromatic aberration of magnification. On the other hand, if the chromatic aberration of magnification is large and the color shading difference between the first focus detection pixel 201 and the second focus detection pixel 202 is large, $\Delta G$ becomes large, so that the focus detection error due to the chromatic aberration of magnification also increases.

In general, more or less of the chromatic aberration of magnification of the imaging optical system exists, and the color shading difference in the two focus detection pixels tends to become larger as the pixels are located farther away from the central image height. Furthermore, since chromatic aberration of magnification and color shading difference are affected by manufacturing variations, appropriate correction may be difficult.

[Weighting]

Therefore, in the present embodiment, when generating the focus detection signal from the photoelectric signals of the plurality of focus detection pixels having different spectral sensitivities based on the lens information of the imaging optical system, the weights (addition coefficient set) to be applied to the photoelectric signals are changed, thereby suppressing focus detection error caused by chromatic aberration of magnification. The lens information of the imaging optical system in this embodiment is the lens ID constituting the imaging optical system. Further, in the present embodiment, the plurality of focus detection pixels having different spectral sensitivities are four pixels of three types of red (R), green (G), and blue (B). In general, weights for the photoelectric signals at the time of generating the signal Y (focus detection signal) by adding the outputs of the four pixels have a ratio of R:G:B=1:2:1. On the other hand, in the present embodiment, weights (addition coefficient set) for photoelectric signals are changed based on the lens ID.

[Flow of Focus Detection Processing]

Figure 8:
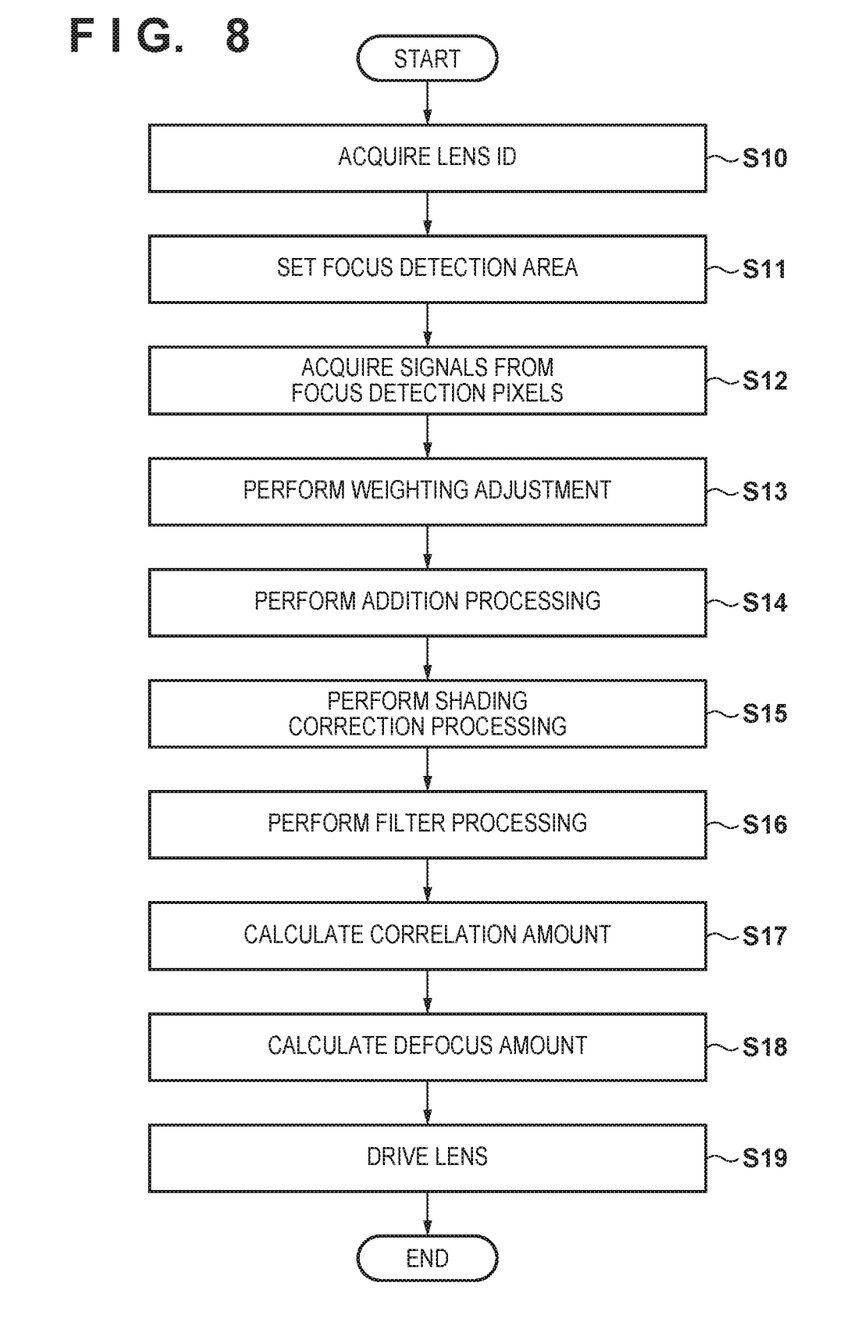
FIG. 8 is a flowchart showing a flow of focus detection processing and image shooting processing according to a first embodiment.

FIG. 8 is a flowchart showing an outline of the flow of focus detection processing in the first embodiment. The operation of FIG. 8 is executed by controlling each configuration of the camera by the CPU 121.

First, in step S10, lens ID of lenses constituting the imaging optical system are acquired. Next, in step S11, a focus detection area in which focus adjustment is to be performed is set in the effective pixel area of the image sensor 107. In step S12, photoelectric signals are acquired from the first focus detection pixels 201 and the second focus detection pixels 202 located in the set focus detection area.

In step S13, based on the lens ID acquired in step S10, weighting adjustment is performed on the photoelectric signals of RGB acquired from the first focus detection pixels 201 and the second focus detection pixels 202 by using the addition coefficient set. The lens ID and the addition coefficient set for the photoelectric signals is stored in the CPU 121. For example, as shown in Table 1, the addition coefficient set in the case of lens ID=A is R:G:B=1:2:1, and the addition coefficient set in the case of ID=B is R:G:B=0:2:0. In the case of lens ID=B, focus detection is performed using only the green (G) photoelectric signals.

TABLE 1

| Lens ID | Addition Coefficients | | |
| --- | --- | --- | --- |
|  | R | G | B |
| A | 1 | 2 | 1 |
| B | 0 | 2 | 0 |
| C | 1 | 2 | 0 |
| D | 0.5 | 2 | 0.5 |
| E | 0.5 | 2 | 0 |

In step S14, the photoelectric signals weighted and adjusted in step S13 are added for each pixel group 200 to generate the first focus detection signal and the second focus detection signal. In order to suppress the signal data amount, addition processing may be performed in the column direction, for example, by three pixel groups 200.

In step S15, shading correction processing (optical correction processing) is performed on the first focus detection signal and the second focus detection signal in order to equalize the intensities.

In step S16, in order to improve the correlation (signal coincidence) to improve the focus detection accuracy, band pass filter processing using a band-pass filter having a specific pass frequency band is performed on the first focus detection signal and the second focus detection signal. Examples of the band pass filter include a differential type filter such as {1, 4, 4, 4, 0, −4, −4, −4, −1} which cuts off DC component and performs edge extraction, and an addition type filter such as {1, 2, 1} which suppresses high frequency component.

Next, in step S17, a shift process for relatively shifting the filtered first focus detection signal and the second focus detection signal in the pupil division direction is performed to calculate a correlation amount representing the degree of coincidence of signals.

Let A(k) be the k-th first focus detection signal after filtering, B(k) be the k-th second focus detection signal, and W be the range of number k corresponding to the focus detection area. Further, let the shift amount by the shift process be s, and the shift range of the shift amount s be $\Gamma$, then a correlation amount COR can be calculated by the equation (1).

$$COR(s) = \sum_{k \in W} |A(k) - B(k-s)|, s \in \Gamma \quad (1)$$

By the shift process with the shift amount s, the k-th first focus detection signal A(k) and the (k−s) second focus detection signal B(k−s) are correspondingly subtracted to generate a shift subtraction signal. Then, the absolute value of the generated shift subtraction signal is calculated, the correlation amount COR(s) is calculated by summing the absolute values for the number k within the range W corresponding to the focus detection area. A correlation amount calculated for each row may be added over a plurality of rows for each shift amount as needed.

In step S18, from the correlation amounts, a shift amount of a real value whose correlation amount is minimized is calculated by a subpixel operation, and the calculated shift amount is taken as an image shift amount p. Then, the image shift amount p is multiplied by the conversion coefficient K to detect the defocus amount d. Then, in step S19, lens driving is performed based on the detected defocus amount d.

The focus detection error caused by the chromatic aberration of magnification is a problem that arises when the focus detection signals of the plurality of focus detection pixels having different spectral sensitivities from each other are added in a case where the chromatic aberration of magnification of the imaging optical system is large and the difference in color shading between the first focus detection pixel and the second focus detection pixel is large. Therefore, in the imaging optical system whose chromatic aberration of magnification causes a large focus detection error, the focus detection error can be suppressed by performing focus detection only with green (G) signals as in lens ID=B in Table 1. Further, in the case of a lens with a particularly large chromatic aberration of magnification in B (blue), a detection signal obtained by adding red (R) signal and green (G) signal may be used as in lens ID=C. Further, a detection signal obtained by halving the weights of red (R) and blue (B) signals as in lens ID=D and adding red (R), green (G) and blue (B) signals may be used.

In the first embodiment, the relationship between the lens ID and the addition coefficient set is stored in the CPU 121 of the image capturing apparatus. However, the present invention is not limited to this. For example, instead of the lens ID, a group ID for designating the addition coefficient set is defined, and the addition coefficient set of the lens may be set such that the addition coefficient set for a lens with the group ID=A is R:G:B=1:2:1, the addition coefficient set for a lens with the group ID=B is R:G:B=0:2:0, and so forth. In the interchangeable lens type image capturing apparatus, the interchangeable lens having the imaging optical system has a nonvolatile memory, and the group ID is stored in the memory. The group ID may be transmitted from the interchangeable lens to the image capturing apparatus and the weighting may be performed using the addition coefficient set corresponding to the received group ID.

According to the first embodiment as described above, it is possible to suppress the influence of the magnification aberration of the imaging optical system on the focus detection result, and to perform high-precision focus detection.

Second Embodiment

Next, a second embodiment of the present invention will be described. In the first embodiment, the lens ID or the group ID of the imaging optical system is used as the lens information of the imaging optical system, and weights (addition coefficient set) when adding signals output from a plurality of focus detection pixels having different spectral sensitivities from each other are changed according to the lens information. On the other hand, in the second embodiment, weights (addition coefficient set) for adding signals of a plurality of focus detection pixels having different spectral sensitivities from each other are changed based on chromatic aberration of magnification information as lens information of the imaging optical system. Since the second embodiment is similar to the first embodiment except for changing the weights of the detection signals, the difference will be described, and the description of common points such as the configuration of the camera will be omitted.

Since the focus detection error caused by chromatic aberration of magnification increases as the chromatic aberration of magnification increases, detection error can be suppressed by lowering the weight of photoelectric signal of a focus detection pixel having a large chromatic aberration of magnification. Therefore, in the second embodiment, the relationship between the chromatic aberration of magnification information and the photoelectric signal is stored in the CPU 121 of the image capturing apparatus. The addition coefficient set of photoelectric signal is changed as shown in Table 2 according to amounts of the chromatic aberration of magnification between R and G, and G and B, with G being the reference color. Here, xR is a judgment threshold for the chromatic aberration of magnification between R and G. If an amount of the chromatic aberration of magnification between R and G is less than xR (less than the threshold), the detection signal of R is used, and if xR or more (more than the threshold), the detection signal of R is not used. Similarly, xB is a judgment threshold for the chromatic aberration of magnification between B and G. If an amount of the chromatic aberration of magnification between B and G is less than xB, the detection signal of B is used, and if xB or more, the detection signal of B is not used.

TABLE 2

| Chromatic Aberration of Magnification | | Addition Coefficient | | |
| --- | --- | --- | --- | --- |
| R - G | B - G | R | G | B |
| <xR | <xB | 1 | 2 | 1 |
| <xR | ≥xB | 1 | 2 | 0 |
| ≥xR | <xB | 0 | 2 | 1 |
| ≥xR | ≥xB | 0 | 2 | 0 |

The chromatic aberration of magnification information unique to the lens is stored in the nonvolatile memory of the interchangeable lens having the imaging optical system. Then, the chromatic aberration of magnification information is transmitted from the interchangeable lens to the image capturing device, and weighted addition is performed using an addition coefficient set corresponding to the received chromatic aberration of magnification information.

Since an amount of the chromatic aberration of magnification varies depending on the state of the imaging optical system, for example, chromatic aberration of magnification information according to the zoom state or the focus state may be stored in the nonvolatile memory of the interchangeable lens. In that case, chromatic aberration of magnification information according to the state of the imaging optical system is transmitted to the image capturing apparatus, and weighting is performed using an addition coefficient set corresponding to the received chromatic aberration of magnification information.

In the second embodiment, an adjusting method of changing the addition coefficient set by using chromatic aberration of magnification information as the lens information of the imaging optical system has been described. As lens information of the imaging optical system, it is preferable to use a variable for estimating the detection error caused by chromatic aberration of magnification, and in addition to an amount of the chromatic aberration of magnification, the exit pupil distance and the conversion factor K for converting the image shift amount p to the defocus amount d may be used. Generally, an imaging optical system having a short exit pupil distance is useful for estimating the detection error caused by chromatic aberration of magnification because the color shading difference between the first focus detection pixel 201 and the second focus detection pixel 202 tends to become large. Further, since the imaging optical system with a large conversion factor K will cause an increase in the detection error caused by chromatic aberration of magnification, an adjusting method that changes the addition coefficient set by using the conversion coefficient K as the imaging optical system information is also effective. In the case of using the exit pupil distance and the conversion coefficient K, G is set as a reference color, and the addition coefficient set of colors (R, B), for example, other than the reference color is reduced.

According to the second embodiment as described above, it is possible to suppress the influence of the magnification aberration of the imaging optical system on the focus detection result, and to perform high-precision focus detection.

Third Embodiment

Next, a third embodiment of the present invention will be described. It is known that, in an interchangeable lens type image capturing apparatus, a calibration is performed in a state where a combination of an interchangeable lens and an image capturing apparatus is decided. Accordingly, in the third embodiment, in a state where a combination of interchangeable lens and an image capturing apparatus is decided, proper weights (addition coefficient set) for detected signals are set at the time of calibration. Since the third embodiment is similar to the first embodiment except for changing the weights of the detection signals, the difference will be described, and the description of common points such as the configuration of the camera will be omitted.

There are several patterns considered as the addition coefficient sets, and patterns as shown in Table 3 are used in the third embodiment. The pixel layout of the image sensor 107 of the third embodiment has a Bayer arrangement composed of RGB as shown in FIG. 2, and in this embodiment, the G pixels adjacent to the R pixels are expressed as Gr, the G pixels adjacent to the G pixels are expressed as Gb in order to distinguish between them. The reason for distinguishing between the Gr pixels and the Gb pixels is that considering the optical leakage from the adjacent pixels, it is considered that the spectral sensitivity is different between the Gr pixels and the Gb pixels.

TABLE 3

| Combination | Addition coefficient | | | |
|---|---|---|---|---|
| | R | Gr | Gb | B |
| 1 | 1 | 1 | 1 | 1 |
| 2 | 0 | 1 | 1 | 0 |
| 3 | 0 | 0 | 1 | 0 |

Figure 9:
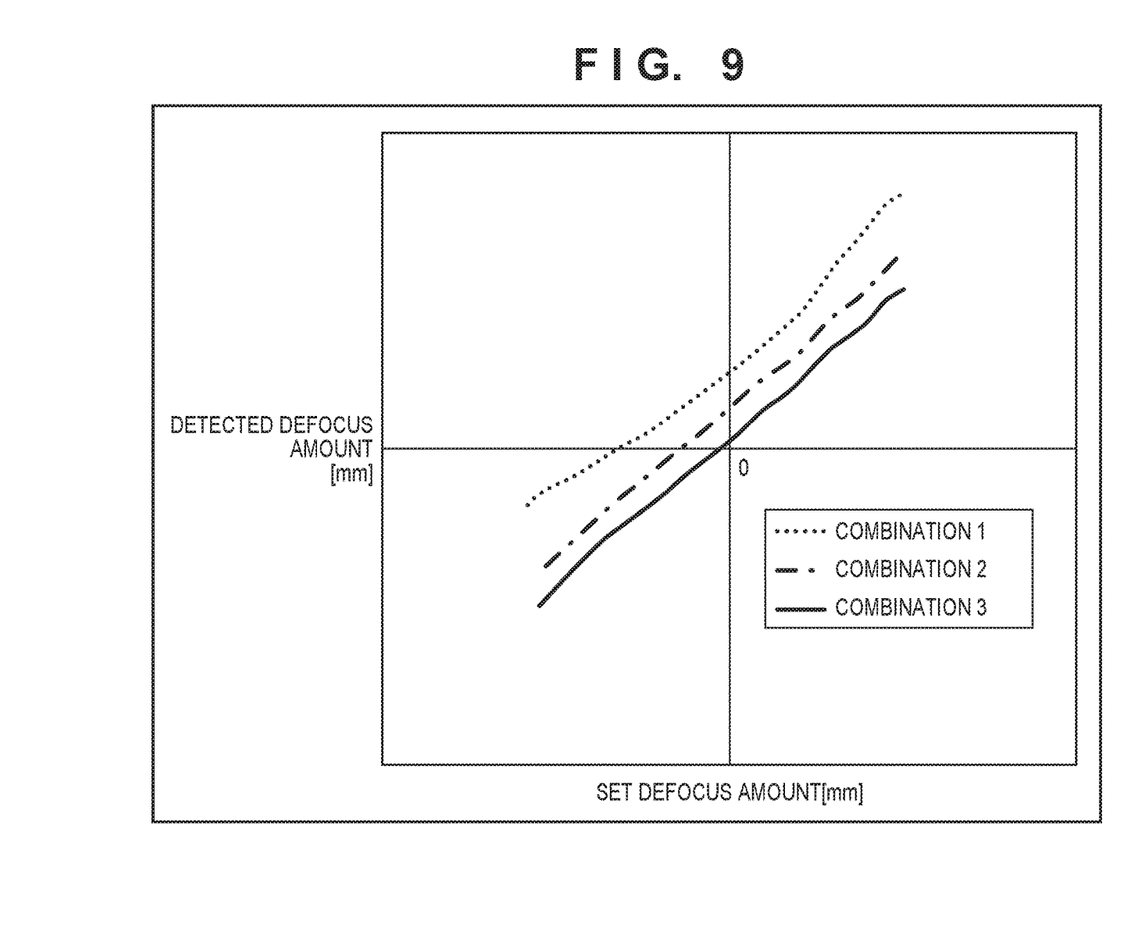
FIG. 9 is a diagram showing an example of a relationship between a set defocus amount and a detected defocus amount according to a third embodiment.

FIG. 9 is a diagram showing an example of a relationship between a set defocus amount and a detected defocus amount in the case where the respective addition coefficient sets are used in the third embodiment. The set defocus amount is a correct defocus amount and the detected defocus amount is obtained by performing weighted addition of the detected defocus amount using one of the addition coefficient sets of combinations 1 to 3 shown in Table 3.

It can be said that the focusing accuracy is highest in a case where 0 is returned as the detected defocus amount when the set defocus amount is 0. Therefore, it is known from FIG. 9 that the addition coefficient set that gives the highest in-focus precision is the combination 3, and in the combination of the interchangeable lens and the image capturing apparatus of the third embodiment, it is optimum to perform the focus detection using the addition coefficient set of the combination 3. Therefore, in the case where focus detection is performed in this combination of the interchangeable lens and the image capturing apparatus, it is preferable to store in the image capturing apparatus to perform focus detection by using the addition coefficient set of the combination 3.

As a method for determining an appropriate addition coefficient set, besides comparing the set defocus amount and the detected defocus amount, an addition coefficient set that gives a closest detection result with respect to the focus position at which contrast becomes highest may be selected. Further, by assuming that the focus detection result using a single color which is considered to give the highest detection accuracy may be regarded as correct, and comparison may be made with the detected defocus amounts obtained by using other combinations of the addition coefficient sets. However, the result of focus detection using a single color has a problem that the S/N ratio deteriorates because the amount of received light is small. In a comparison between different combinations of the addition coefficient sets that can give equivalent results, a combination in which the amount of received light is highest may be selected from the viewpoint of S/N ratio.

Since the influence on the focus detection accuracy due to the chromatic aberration of magnification varies depending on the condition of the lens, an appropriate addition coefficient set may be set for each aperture value. In the case of a zoom lens, an appropriate addition coefficient set may be set for each zoom position. Depending on the addition coefficient set, the parameters necessary for calculating the focus detection result may be greatly changed in some cases. When the conversion factor K and the shading correction value change as described above depending on the addition coefficients for the focus detection signals, it is advisable to calculate appropriate values at the time of calibration and store it in the image capturing apparatus so as to use it at the time of focus detection.

According to the third embodiment as described above, it is possible to suppress the influence of the magnification aberration of the imaging optical system on the focus detection result, and to perform high-precision focus detection.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2017-004603, filed on Jan. 13, 2017 and 2017-236295, filed on Dec. 8, 2017 which are hereby incorporated by reference herein in their entirety.

What is claimed is:

1. A focus detection apparatus that performs phase difference focus detection based on signals of a plurality of colors obtained from an image sensor, which is covered by color filters of the plurality of colors and has a plurality of photoelectric conversion portions for each of a plurality of microlenses, that performs photoelectric conversion on light incident on the image sensor via an imaging optical system and outputs electric signals, the apparatus comprising at least one processor and/or circuit configured to function as following units:

an acquisition unit that acquires an addition coefficient indicating weights to be applied to the signals of the plurality of colors on the basis of a characteristic of chromatic aberration of magnification of the imaging optical system;

a generation unit that generates a pair of focus detection signals by performing weighted addition on the signals of the plurality of colors using the addition coefficient; and a detection unit that detects an image shift amount between the pair of focus detection signals.

2. The focus detection apparatus according to claim 1, wherein the acquisition unit stores a plurality of addition coefficients in advance, and selects one of the plurality of addition coefficients based on information of the imaging optical system.

3. The focus detection apparatus according to claim 2, wherein the information of the imaging optical system is lens identification information.

4. The focus detection apparatus according to claim 1, wherein the acquisition unit stores a plurality of addition coefficients in advance, and selects one of the plurality of addition coefficients based on information for designating one of the plurality of addition coefficients according to the characteristic of the chromatic aberration of magnification of the imaging optical system.

5. The focus detection apparatus according to claim 1, wherein the characteristic of the chromatic aberration of magnification of the imaging optical system is information indicating a magnitude of the chromatic aberration of magnification of the imaging optical system.

6. The focus detection apparatus according to claim 5, wherein the information indicating the magnitude of the chromatic aberration of magnification of the imaging optical system is an amount of chromatic aberration of magnification between a reference color among the plurality of colors and another of the plurality of colors, and an addition coefficient for a color having an amount of chromatic aberration of magnification equal to or greater than a predetermined threshold is made smaller than that for a color having an amount of chromatic aberration of magnification less than the threshold.

7. The focus detection apparatus according to claim 5, wherein the information indicating the magnitude of the chromatic aberration of magnification of the imaging optical system is an exit pupil distance from the image sensor to the imaging optical system, and an addition coefficient for a color other than a reference color among the plurality of colors is set smaller in a case where the exit pupil distance is equal to or greater than a predetermined threshold than in a case where the exit pupil distance is less than the threshold.

8. The focus detection apparatus according to claim 5, wherein the information indicating the magnitude of the chromatic aberration of magnification of the imaging optical system is a conversion coefficient for converting the image shift amount to a defocus amount of the imaging optical system, and an addition coefficient for a color other than a reference color among the plurality of colors is set smaller in a case where the conversion coefficient is equal to or greater than a predetermined threshold than in a case where the conversion coefficient is less than the threshold.

9. The focus detection apparatus according to claim 1, wherein the acquisition unit acquires the addition coefficient from the imaging optical system.

10. The focus detection apparatus according to claim 1, wherein the imaging optical system is detachable from an image capturing apparatus having the image sensor, and
the acquisition unit stores a plurality of addition coefficients in advance, and selects an addition coefficient that gives an image shift amount closest to a predetermined image shift amount among image shift amounts obtained by performing weighted addition on the signals of the plurality of colors using the plurality of addition coefficients, and stores the combination of the imaging optical system and the image capturing apparatus and the selected addition coefficient in relation to each other.

11. The focus detection apparatus according to claim 10, wherein the acquisition unit selects an addition coefficient further in accordance with a state of the imaging optical system among the plurality of addition coefficients, and stores the selected addition coefficient in relation to the state of the imaging optical system.

12. An image capturing apparatus comprising:
a focus detection apparatus that performs phase difference focus detection based on signals of a plurality of colors obtained from an image sensor, which is covered by color filters of the plurality of colors and has a plurality of photoelectric conversion portions for each of a plurality of microlenses, that performs photoelectric conversion on light incident on the image sensor via an imaging optical system and outputs electric signals, the apparatus comprising at least one processor and/or circuit configured to function as following units:
an acquisition unit that acquires an addition coefficient indicating weights to be applied to the signals of the plurality of colors on the basis of a characteristic of chromatic aberration of magnification of the imaging optical system;
a generation unit that generates a pair of focus detection signals by performing weighted addition on the signals of the plurality of colors using the addition coefficient; and
a detection unit that detects an image shift amount between the pair of focus detection signals;
the image sensor; and
at least one processor and/or circuit configured to function as a control unit that controls the imaging optical system based on the image shift amount.

13. The image capturing apparatus according to claim 12, further comprising the imaging optical system.

14. A focus detection method that performs phase difference focus detection based on signals of a plurality of colors obtained from an image sensor, which is covered by color filters of the plurality of colors and has a plurality of photoelectric conversion portions for each of a plurality of microlenses, that performs photoelectric conversion on light incident on the image sensor via an imaging optical system and outputs electric signals, the method comprising:
acquiring an addition coefficient indicating weights to be applied to the signals of the plurality of colors on the basis of a characteristic of chromatic aberration of magnification of the imaging optical system;
generating a pair of focus detection signals by performing weighted addition on the signals of the plurality of colors using the addition coefficient; and
detecting an image shift amount between the pair of focus detection signals.

* * * * *